(12) United States Patent
Seo

(10) Patent No.: US 10,672,476 B2
(45) Date of Patent: Jun. 2, 2020

(54) STORAGE DEVICE USING PROGRAM SPEED AND METHOD OF OPERATING THE SAME

(71) Applicant: SK hynix Inc., Gyeonggi-do (KR)

(72) Inventor: Ji Hyun Seo, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 219 days.

(21) Appl. No.: 15/818,870

(22) Filed: Nov. 21, 2017

(65) Prior Publication Data

US 2018/0294031 A1 Oct. 11, 2018

(30) Foreign Application Priority Data

Apr. 11, 2017 (KR) .................. 10-2017-0046825

(51) Int. Cl.
| | |
|---|---|
| *G06F 12/00* | (2006.01) |
| *G11C 15/04* | (2006.01) |
| *G11C 16/34* | (2006.01) |
| *G11C 16/10* | (2006.01) |
| *G06F 13/00* | (2006.01) |
| *G06F 13/28* | (2006.01) |
| *G11C 7/20* | (2006.01) |
| *G11C 16/04* | (2006.01) |

(52) U.S. Cl.
CPC ............ *G11C 15/046* (2013.01); *G11C 16/10* (2013.01); *G11C 16/3427* (2013.01); *G11C 7/20* (2013.01); *G11C 16/0483* (2013.01)

(58) Field of Classification Search
CPC .................................................... G11C 15/046
See application file for complete search history.

(56) References Cited

U.S. PATENT DOCUMENTS

| | | | | |
|---|---|---|---|---|
| 2004/0080980 A1* | 4/2004 | Lee | ..................... | G11C 11/5628 365/185.17 |
| 2007/0047314 A1* | 3/2007 | Goda | ................. | G11C 16/0483 365/185.18 |
| 2009/0168510 A1* | 7/2009 | Lee | ........................ | G11C 16/10 365/185.2 |
| 2012/0057389 A1* | 3/2012 | Ryu | ........................ | G11C 16/20 365/49.1 |
| 2015/0049554 A1* | 2/2015 | Yim | .................... | G11C 16/3418 365/185.18 |
| 2015/0070998 A1* | 3/2015 | Dong | ..................... | G11C 16/26 365/185.17 |
| 2015/0170746 A1* | 6/2015 | Oowada | ................. | G11C 16/10 365/185.18 |

FOREIGN PATENT DOCUMENTS

KR 1020160035443 3/2016

* cited by examiner

*Primary Examiner* — Mark A Giardino, Jr.
(74) *Attorney, Agent, or Firm* — IP & T Group LLP

(57) ABSTRACT

Provided herein may be a storage device having disturb characteristics and a method of operating the storage device. The storage device may include one or more semiconductor memory devices, each including a plurality of memory cells, and a memory controller configured to set levels of pass voltages of the one or more semiconductor memory devices depending on program speeds of the plurality of memory cells.

18 Claims, 10 Drawing Sheets

| PROGRAM SPEED | NAND A > NAND B > NAND C |
| PROGRAM VOLTAGE | VPGM A < VPGM B < VPGM C |
| PASS VOLTAGE | VPASS A < VPASS B < VPASS C |

FIG. 11

| NUMBER OF OFF-CELLS (OC) | VPASS_ref |
|---|---|
| $0 \leq OC < ref1$ | VPASS 1 |
| $ref1 \leq OC < ref2$ | VPASS 2 |
| $ref2 \leq OC < ref3$ | VPASS 3 |
| ⋮ | |
| $refn-1 \leq OC < refn$ | VPASS n |

INCREASE ↓  INCREASE ↑

STORAGE DEVICE USING PROGRAM SPEED AND METHOD OF OPERATING THE SAME

CROSS-REFERENCE TO RELATED APPLICATION

The present application claims priority under 35 U.S.C. § 119(a) to Korean patent application number 10-2017-0046825 filed on Apr. 11, 2017 in the Korean Intellectual Property Office, the entire disclosure of which is incorporated herein by reference.

BACKGROUND

Field of Invention

Various embodiments of the present disclosure generally relate to an electronic device and, more particularly, to a storage device and a method of operating the storage device.

Description of Related Art

A storage device is a device for storing data under the control of a host device, such as, for example, a computer, a smart phone, or a smart pad. Examples of a storage device include a device for storing data in a magnetic disk, as in the case of a hard disk drive (HDD) and a device for storing data in a semiconductor memory, especially in a nonvolatile memory, as in the case of a solid-state drive (SSD) or a memory card.

The nonvolatile memory is a memory device in which data stored therein is maintained even when power is turned off. Representative examples of a nonvolatile memory device include a read-only memory (ROM), a programmable ROM (PROM), an electrically programmable ROM (EPROM), an electrically erasable programmable ROM (EEPROM), a flash memory, a phase-change random access memory (PRAM) a magnetic RAM (MRAM), a resistive RAM (RRAM) a ferroelectric RAM (FRAM), etc. The flash memory is classified into a NOR type memory and a NAND type memory.

SUMMARY

Various embodiments of the present disclosure are directed to a storage device having improved disturb characteristics and a method of operating the storage device.

An embodiment of the present disclosure provides semiconductor memory device. The semiconductor memory device includes a memory cell array including a plurality of memory blocks, a peripheral circuit configured to perform operations on the memory cell array, and a control logic configured to control the peripheral circuit based on setting information stored in a contents addressable memory (CAM) block, among the plurality of memory blocks, when the operations are performed. The setting information includes a level of a pass voltage applied to a plurality of memory cells included in the memory cell array, and the level of the pass voltage is determined depending on program speeds of the plurality of memory cells.

An embodiment of the present disclosure provides a storage device. The storage device includes one or more semiconductor memory devices, each including a plurality of memory cells, and a memory controller configured to set levels of pass voltages of the one or more semiconductor memory devices depending on program speeds of the plurality of memory cells.

An embodiment of the present disclosure provides a method of operating a storage device. The storage device includes a semiconductor memory device having a plurality of memory cells and a memory controller configured to control the semiconductor memory device. The method includes measuring program speeds of a part or all of the plurality of memory cells, and setting a level of a pass voltage of the semiconductor memory device depending on the measured program speeds.

BRIEF DESCRIPTION OF THE DRAWINGS

FIG. 11 is a table explaining a method of determining a pass voltage of a semiconductor memory device, according to an embodiment of the present disclosure.

DETAILED DESCRIPTION

Figure 1:
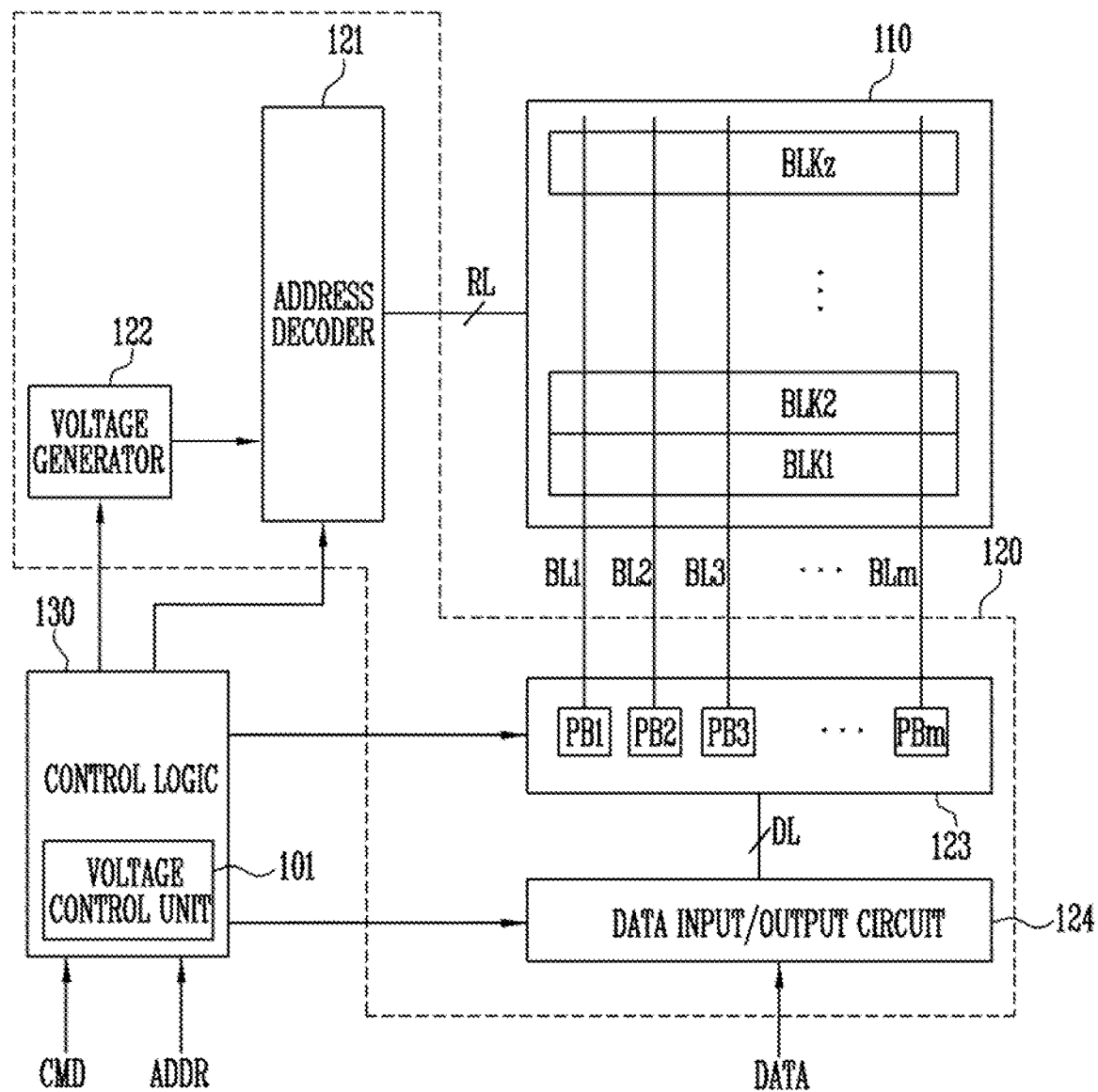
FIG. 1 is a block, diagram illustrating a semiconductor memory device, according to an embodiment of the present disclosure.

Exemplary embodiments of the present invention will now be described more fully hereinafter with reference to the accompanying drawings; however, we note that the present invention may be embodied in different forms and should not be limited only to the embodiments set forth herein. Rather, these embodiments are provided so that this disclosure will be thorough and complete, and will fully convey the present invention embodiments to those skilled in the art.

In the drawing figures, dimensions may be exaggerated for clarity of illustration. Also, it will be understood that when an element is referred to as being "between" two elements, it can be the only element between the two elements, or one or ore intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

A singular form may include a plural from s long s it is not specifically mentioned in a sentence.

Furthermore, unless defined otherwise, all the terms used in this specification including technical and scientific terms have the same meanings as would be generally understood by those skilled in the related art in view of the present disclosure. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a block diagram illustrating a semiconductor memory device 100 according to an embodiment of the present disclosure.

The semiconductor memory device 100 may be implemented in many different forms, such as a NAND flash memory, a vertical NAND flash memory, a NOR flash memory device, a resistive random-access memory (RRAM), a phase-change memory (PRAM), a magnetoresistive random access memory (MRAM), a ferroelectric random access memory (FRAM), or a spin transfer torque random access memory (STT-RAM). In addition, the semiconductor memory device 100 according to the present disclosure may be implemented as a three-dimensional array structure. The present disclosure may also be applied not only to a flash memory in which a charge storage layer is implemented as a conductive floating gate (FG), but also to a charge trap flash (CTF) memory in which a charge storage layer is implemented as an insulating layer.

The semiconductor memory device 100 is operated under the control of an external controller (not illustrated). The semiconductor memory device 100 may receive a command CMD, an address ADDR, and data DATA from the external controller. The semiconductor memory device 100 may perform an operation corresponding to the command CMD received from the external controller. In an embodiment, the command CMD may correspond to any one of a program operation, a read operation, and an erase operation. In various embodiments, the command CMD may be a parameter set (SET PARAMETER) command or a feature set (SET FEATURE) command for f changing a register value included in the semiconductor memory device 100. Alternatively, the command CMD may be a parameter get (GET PARAMETER) command or a feature get (GET FEATURE) command for outputting (reading) a register value which is included in the semiconductor memory device 100.

During a program operation, the semiconductor memory device 100 may receive a program command, an address, and data from the external controller. The semiconductor memory device 100 may program the data in a memory region (also referred to hereinafter as region) selected in response to the address. During a read operation, the semiconductor memory device 100 may receive a read command and an address from the external controller. The semiconductor memory device 100 may read data from a region selected according to the received address. During an erase operation, the semiconductor memory device 100 may receive an erase command and an address from the external controller. The semiconductor memory device 100 may erase data stored in a region selected in response to the address. The erase region unit may be the same or different from the program and read region units.

Referring to FIG. 1, the semiconductor memory device 100 may include a memory cell array 110, a peripheral circuit 120, and a control logic 130. The peripheral circuit 120 may drive the memory cell array 110. For example, the peripheral circuit 120 may drive the memory cell array 110 so that a program operation, a read operation, and an erase operation are performed. The peripheral circuit 120 may include an address decoder 121, a voltage generator 122, a read and write circuit 123, and a data input/output circuit 124.

The memory cell array 110 may include a plurality of memory blocks BLK1 to BLKz. The plurality of memory blocks BLK1 to BLKz may be coupled to the address decoder 121 through a plurality of row lines RL. The memory blocks BLK1 to BLKz may be coupled to the read and write circuit 123 through a plurality of bit lines BL1 to BLm. Each of the memory blocks BLK1 to BLKz may include a plurality of memory cells. In an embodiment, each of the memory blocks BLK1 to BLKz may include a plurality of memory cells arranged in a two-dimensional array of rows and columns, with the memory blocks BLK1 to BLKz arranged in parallel to form a three-dimensional array 110. In an embodiment, the plurality of memory cells may be nonvolatile memory cells. In the plurality of memory cells memory cells coupled to the same word line may be defined as a single page. That is, each of the memory blocks BLK1 to BLKz may include a plurality of pages. Hence the memory cell array 110 may also be composed of a plurality of pages arranged in groups of memory blocks. In an embodiment, each of the plurality of memory blocks BLK1 to BLKz included in the memory cell array 110 may also include a plurality of dummy cells. One or more dummy cells may be connected in series between a drain select transistor and the memory cells and between a source select transistor and the memory cells.

In an embodiment, a program operation and a read operation of the semiconductor memory device 100 may be performed on a page basis, and an erase operation may be performed on a block basis.

The plurality of memory blocks BLK1 to BLKz may be divided into a main block that stores user data and extra blocks. The extra blocks are blocks other than the main block, depending on the usage thereof. Alternatively, the memory blocks may be divided into a data block that stores user data and system blocks. The system blocks are blocks other than the data block. In an embodiment, the extra blocks or the system blocks may be contents addressable memory (CAM) blocks. The CAM blocks may store therein various types of setting information required for the operation of the semiconductor memory device 100. For example, the CAM blocks may store information about the levels of various types of voltages used in the semiconductor memory device 100, information about timings at which the corresponding voltages are applied or discharged, various types of offset information, etc. The data or information stored in the CAM blocks is not limited and may include all pieces of setting information required for the operation of the semiconductor memory device 100. In accordance with an embodiment of the present disclosure, in the CAM blocks, pass voltage level information related to the voltage level of a pass voltage that is applied to unselected word lines during the program operation or read operation of the semiconductor memory device 100 may be stored.

Each of the memory cells of the semiconductor memory device 100 may be implemented as a single-level cell (SLC) capable of storing a single data bit, or a multi-level cell (MLC) capable of storing two or more data bits, such as a triple-level cell (TLC) capable of storing three data bits, or a quad-level cell (QLC) capable of storing four data bits.

The address decoder 121 may be coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may be configured to be operated under the control of the control logic 130. The address decoder 121 may receive the address ADDR from the control logic 130.

The address decoder 121 may be configured to decode a block address of the received address ADDR. The address decoder 121 may select at least one memory block from the memory blocks BLK1 to BLKz in response to the decoded block address. The address decoder 121 may also be configured to decode a row address of the received address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verification pass voltage higher than the verify voltage to unselected word lines. During a read operation, the address decoder 121 may apply a read voltage to a selected word line and apply a read pass voltage higher than the read voltage to unselected word lines. During an erase operation, the address ADDR input to the semiconductor memory device 100 may include a block address. The address decoder 121 may decode the block address and select a single memory block in response to the decoded block address. During an erase operation, the address decoder 121 may apply a ground voltage to word lines coupled to the selected memory block.

In an embodiment, the address decoder 121 may be configured to decode a column address of the received address ADDR. A decoded column address may be transferred to the read and write circuit 123. In an exemplary embodiment, the address decoder 121 may include components such as a row decoder, a column decoder, and an address buffer for performing the aforementioned functions of the address decoder 121.

The voltage generator 122 may be configured to generate a plurality of voltages using an external supply voltage provided to the semiconductor memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 may be used as an operating voltage of the semiconductor memory device 100.

In an embodiment, the voltage generator 122 may generate a plurality of voltages using an external supply voltage or an internal supply voltage. The voltage generator 122 may be configured to generate various voltages required by the semiconductor memory device 100. For example, the voltage generator 122 may generate a plurality of program voltages, a plurality of pass voltages, and a plurality of select voltages.

For example, the voltage generator 122 may include a plurality of pumping capacitors for receiving the internal supply voltage and may generate a plurality of voltages by selectively activating one or more of the pumping capacitors under the control of the control logic 130.

The generated voltages may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data to be stored from the data input/output circuit 124 through data lines DL.

During a program operation the first m-th page buffers PB1 to PBm may transfer the data received from the data input/output circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage (e.g. a ground voltage) is applied may have increased threshold voltages. Threshold voltages of memory cells coupled to a bit line to which a program prohibition voltage (e.g. a supply voltage) is applied may be maintained. During a program verify operation, the first to m-th page buffers read page data from the selected memory cells through the bit lines BL1 to BLm.

During a read operation, the read and write circuit 123 reads data DATA from the memory cells in the selected page through the bit lines BL1 to BLm and outputs the read data DATA to the data input/output circuit 124.

In an embodiment, the read and write circuit 123 may include a column select circuit.

The data input/output circuit 124 is coupled to the first to m-th page buffers PB1 to PBm through the data lines DL. The data input/output circuit 124 is operated under the control of the control logic 130.

The data input/output circuit 124 may include a plurality of input/output buffers (not illustrated) for receiving input data. During a program operation, the data input/output circuit 124 receives the data DATA to be stored from the external controller (not shown). During a read operation, the data input/output circuit 124 outputs the read data DATA from the first to m-th page buffers PB1 to PBm included in the read and write circuit 123, to the external controller.

The control logic 130 may be coupled to the address decoder 121, the voltage generator 122 the read and write circuit 123, and the data input/output circuit 124. The control logic 130 may be configured to control the operation of the semiconductor memory device 100. The control logic 130 may be operated in response to the command CMD received from the external controller.

When power is supplied to the semiconductor memory device 100 (power-on), the control logic 130 may store or load the setting information which is stored in the CAM blocks of the memory cell array 110, in a voltage control unit 101. The setting information which is stored in or loaded into the voltage control unit 101 may include information about the levels of voltages required for the operation of the semiconductor memory device 100 and information about timings at which the voltages are applied or discharged. For example, the setting information stored in or loaded into the voltage control unit 101 may include information about the level of a pass voltage or a read pass voltage that is applied to unselected word lines during a program operation or a read operation, respectively.

The control logic 130 may control the peripheral circuit 120 based on the setting information stored in the voltage control unit 101. For example, the control logic 130 may control the voltage generator 122 so that a voltage corresponding to the level of the pass voltage or the read pass voltage stored in the voltage control unit 101 is generated. Also, for example, the control logic 130 may control the address decoder 121 so that the generated pass voltage or read pass voltage is individually applied to unselected word lines during the program operation or the read operation.

In accordance with an embodiment of the present disclosure, information about the level of the pass voltage or the read voltage stored in the CAM blocks may be a value that is determined depending on the program speeds of the plurality of memory cells included in the memory cell array 110. In an embodiment, information about the level of the pass voltage or read voltage stored in the CAM blocks may be either a value that is determined depending on the program speeds of memory cells at a specific location included in the memory cell array 110 or a value that is determined depending on the average of the program speeds of all memory cells included in the memory cell array 110.

Figure 2:
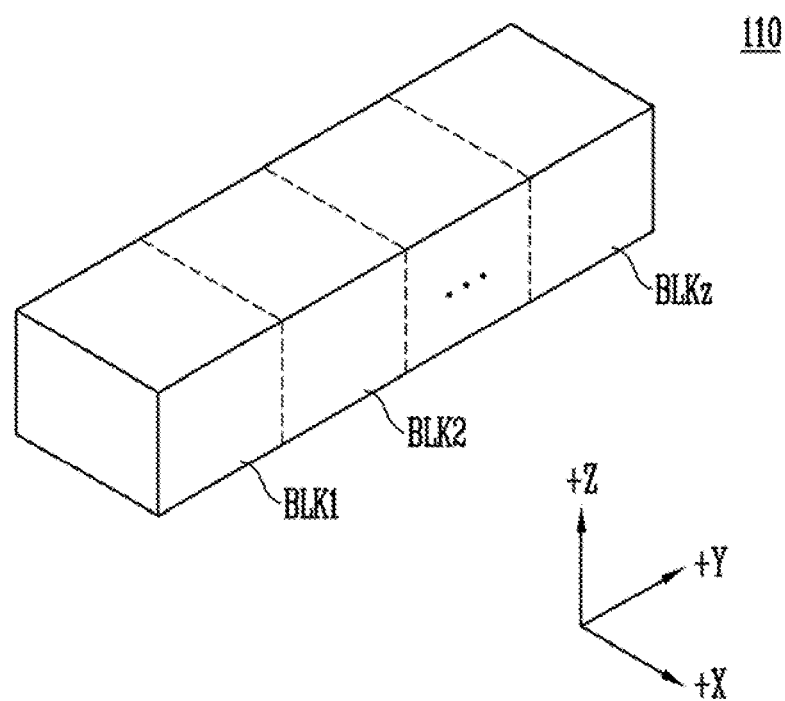
FIG. 2 is a diagram illustrating a memory cell array shown in FIG. 1.

FIG. 2 is a diagram illustrating a memory cell array 110 shown in FIG. 1.

Referring to FIG. 2, the memory cell array 110 may include a plurality of memory blocks BLK1 to BLKz with each memory block having a three-dimensional (3D) structure. Each memory block includes a plurality of memory cells stacked in a plurality of layers on a substrate. The memory cells are arranged along a positive X (+X) direction, a positive Y (+Y) direction, and a positive Z (+Z) direction. The structure of each memory block will be described in detail below with reference to FIGS. 3 and 4.

Figure 3:
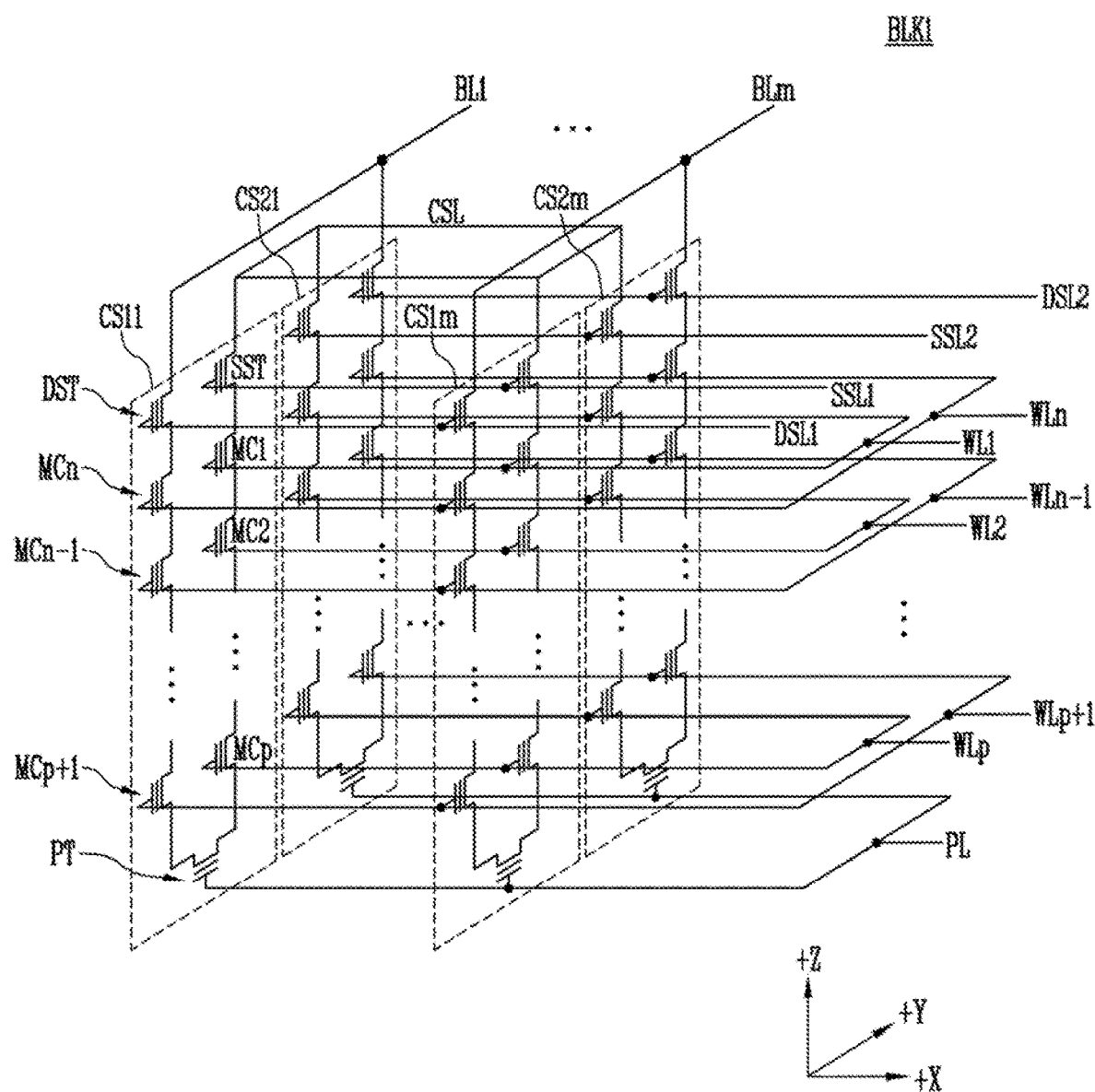
FIG. 3 is a circuit diagram illustrating a memory block shown in FIG. 2.

FIG. 3 is a circuit diagram illustrating an embodiment of one of the memory blocks BLK1 to BLKz of FIG. 2.

Referring to FIG. 3 the first memory block BLK1 includes a plurality of cell strings CS11 to CS1*m* and CS21 to CS2*m*. In the illustrated embodiment of FIG. 3, each of the cell strings CS11 to CS1*m* and CS21 to CS2*m* is formed in a 'U' shape. In the embodiment of FIG. 3 the first memory block BLK1 has m cell strings which are arranged in a row direction (i.e. a positive (+) X direction) and two cell strings which are arranged in a column direction (i.e. a positive (+) Y direction). However, this illustration is only an example made for convenience of description. It will be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between a common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 3, source select transistors of cell strings CS11 to CS1*m* in a first row are coupled to a first source select line SSL1. Source select transistors of cell strings CS21 to CS2*m* in a second row are coupled to a second source select line SSL2.

In an embodiment, source select transistors of the cell strings CS11 to CS1*m* and CS1 to CS2*m* may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first, to p-th memory cells MC1 to MCp are sequentially arranged in a direction opposite to a positive (+) Z direction and are connected in series between the source select transistor SST and the pipe transistor PT. The p+1-th to nth memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The gate of the pipe transistor PT of each cell string is coupled to a pipe line PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1$m$ in the first row are coupled to a first drain select line DSL1. Drain select transistors of cell strings CS21 to CS2$m$ in the second row re coupled to a second drain select line DSL2.

Cell strings arranged in a column direction are coupled to bit lines extended in a column direction. In FIG. 3, cell strings CS11 and CS21 in a first column are coupled to a first bit line BL1. Cell strings CS1$m$ and CS2$m$ in an m-th column are coupled to an m-th bit line BLm.

The memory cells coupled to the same word line in cell strings arranged in a row direction constitute a single page. For example, memory cells coupled to the first word line WL1, among the cell strings CS11 to CS1$m$ in the first row, constitute a single page. Memory cells coupled to the first word line WL1 among the cell strings CS21 to CS2$m$ in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1$m$ or CS21 to CS2$m$ arranged in a row direction, may be coupled to the even bit lines, respectively, and odd-numbered cell strings, among the cell strings CS11 to CS1$m$ or CS21 to CS2$m$ arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation on the memory block BLK1 is improved, but the size of the memory block BLK1 is increased. As fewer memory cells are provided, the size of the memory block BLK1 is reduced, but the reliability of the operation on the memory block BLK1 may be deteriorated.

In order to efficiently control the one or more dummy memory cells, each of the dummy memory cells may have a required threshold voltage. Before or after the erase operation on the memory block BLK1 is performed, a program operation may be performed on all or some of the dummy memory cells. When an erase operation is performed after the program operation has been performed, the dummy memory cells may have the required threshold voltages by controlling voltages applied to the dummy word lines coupled to respective dummy memory cells.

Figure 4:
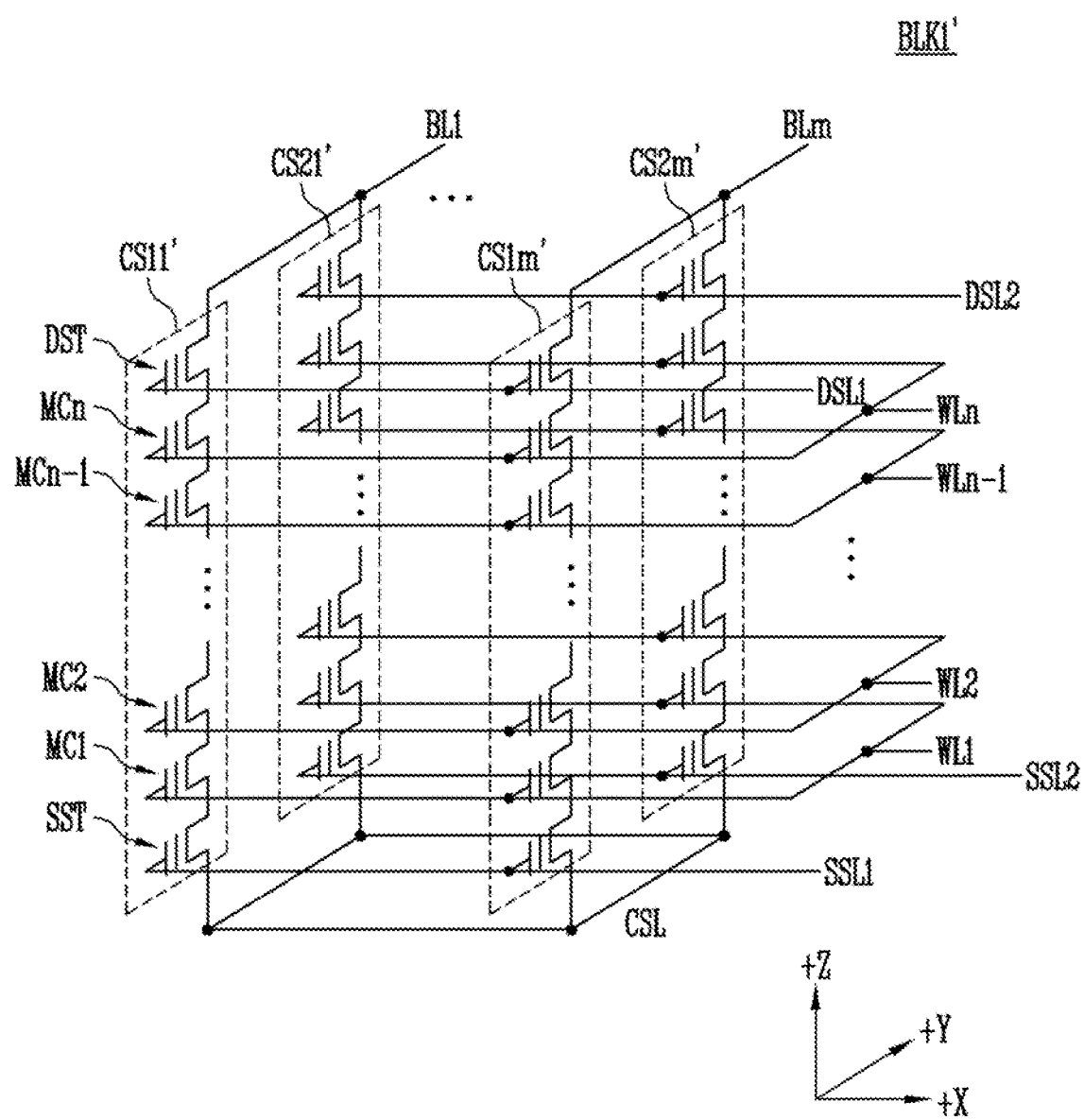
FIG. 4 is a circuit diagram illustrating a memory block shown in FIG. 2.

FIG. 4 is a circuit diagram illustrating any one of the memory blocks BLK1 to BLKz of FIG. 2.

Referring to FIG. 4, a first memory block BLK1' includes a plurality of cell strings CS11' to CS1$m$ and CS1' to CS2$m$. Each of the plurality of cell strings CS11' to CS1$m$' and CS21' to CS2$m$' is extended along a positive Z (+Z) direction. Each of the cell strings CS11' to CS1$m$' and CS1' to CS2$m$' includes at least one source select transistor SST, first to n-th memory cells MC1 to MCn, and at least one drain select transistor DST, which are stacked on a substrate (not illustrated).

The source select transistor SST of each cell string is connected between a common source line CSL and the memory cells MC1 to MCn. The source select transistors of cell strings arranged in the same row are coupled to the same source select line. Source select transistors of cell strings CS11' to CS1$m$' arranged in a first row are coupled to a first source select line SSL1. Source select transistors of cell strings CS21' to CS2$m$' arranged in a second row are coupled to a second source select line SSL2. In an embodiment, source select transistors of the cell strings CS11' to CS1$m$' and CS21' to CS2$m$' may be coupled in common to a single source select line.

The first to n-th memory cells MC1 to MCn in each cell string are connected in series between the source select transistor SST and the drain select transistor DST. The gates of the first to nth memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1$m$' in the first row are coupled to a first drain select line DSL1. The drain select transistors of the cell strings CS21' to CS2$m$' in the second row are coupled to a second drain select line DSL2.

As a result, the memory block BLK1' of FIG. 4 has an equivalent circuit similar to that of the memory block BLK1 of FIG. 3 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1$m$' or CS21' to CS2$m$' arranged in a row direction, may be coupled to the even bit lines, respectively, and odd-numbered cell strings, among the cell strings CS11' to CS1$m$' or CS21' to CS2$m$' arranged in the row direction, may be coupled to the odd bit lines, respectively.

In an embodiment, one or more of the first to nth memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation on the memory block BLK1 is improved, but the size of the memory block BLK1 is increased. As fewer memory cells are provided, the size of the memory block BLK1 is reduced, but the reliability of the operation on the memory block BLK1' may be deteriorated.

In order to efficiently control the one or more dummy memory cells, each of the dummy memory cells may have a required threshold voltage. Before or after the erase operation on the memory block BLK1' is performed, a program operation may be performed on all or some of the dummy memory cells. When an erase operation performed after the program operation has been performed, the dummy memory cells may have the required threshold voltages by controlling voltages applied to the dummy word lines coupled to respective dummy memory cells.

Figure 5:
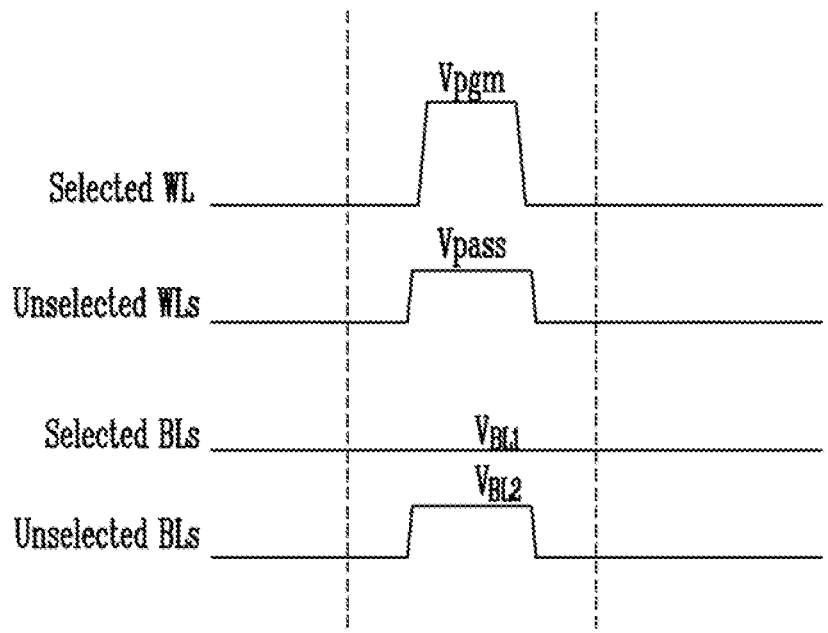
FIG. 5 is a waveform diagram explaining voltages applied to word lines and bit lines during a program operation of a semiconductor memory device.

FIG. 5 is a waveform diagram explaining voltages applied to word lines and bit lines during a program operation of a semiconductor memory device.

The program operation may include a plurality of program loops. A single program loop may be divided into a program voltage apply step and a program verify step. FIG. 5 illustrates voltages that are applied to word lines and bit lines at the program voltage apply step of the single program loop during the program operation.

Referring to FIG. 5, a program voltage Vpgm may be applied to a selected word line (Selected WL). In an embodiment, the program voltage Vpgm may be generated using an incremental step pulse programming (ISPP) method. That is, the level of the program voltage Vpgm may be increased or decreased by a predetermined step voltage as program loops are repeated. The number of applications of the program voltages Vpgm used in respective program loops, the levels of the program voltages Vpgm, and the times at which the program voltages Vpgm are applied (hereinafter, also referred to as "application times" of the program voltages) may be determined in various forms according to external control (e.g., by a memory controller) or internal control (e.g., by the control logic 130 of FIG. 1).

A pass voltage Vpass may be applied to the remaining word lines (Unselected WLs), i.e., the word lines other than the selected word line (Selected WL). The pass voltage Vpass may be generated based on setting information which is stored in the voltage control unit 101, described above with reference to FIG. 1. Pass voltages Vpass having the same level may be applied to the unselected word lines (Unselected WLs). In an embodiment, the pass voltages Vpass may have different levels depending on the locations of word lines. For example, the control logic 130, described above with reference to FIG. 1, may generate the pass voltage Vpass based on the setting information stored in the voltage control unit 101, may apply an offset voltage for each word line (positive offset or negative offset) having a different value depending on the location of the word line, to the generated pass voltage Vpass, and may then apply the resulting pass voltage to the unselected word lines (Unselected WLs).

A first bit line voltage $V_{BL1}$ may be applied to one or more selected bit lines (Selected BLs) which are coupled to memory cells to be programmed. The first bit line voltage $V_{BL1}$ may be a program permission voltage, which may be a ground voltage GND (0 V) in an embodiment.

A second bit line voltage $V_{BL2}$ may be applied to the unselected bit lines (Unselected BLs), i.e., bit lines which are coupled to memory cells that are prohibited from being programmed. The second bit line voltage $V_{BL2}$ may be a program prohibition voltage, which may be a supply voltage VDD.

As the voltages illustrated in FIG. 5 are respectively applied to the selected word line (Selected WL), unselected word lines (Unselected WLs), selected bit lines (Selected BLs), and unselected bit lines (Unselected BLs), the program operation may be performed on selected memory cells.

Figure 6:
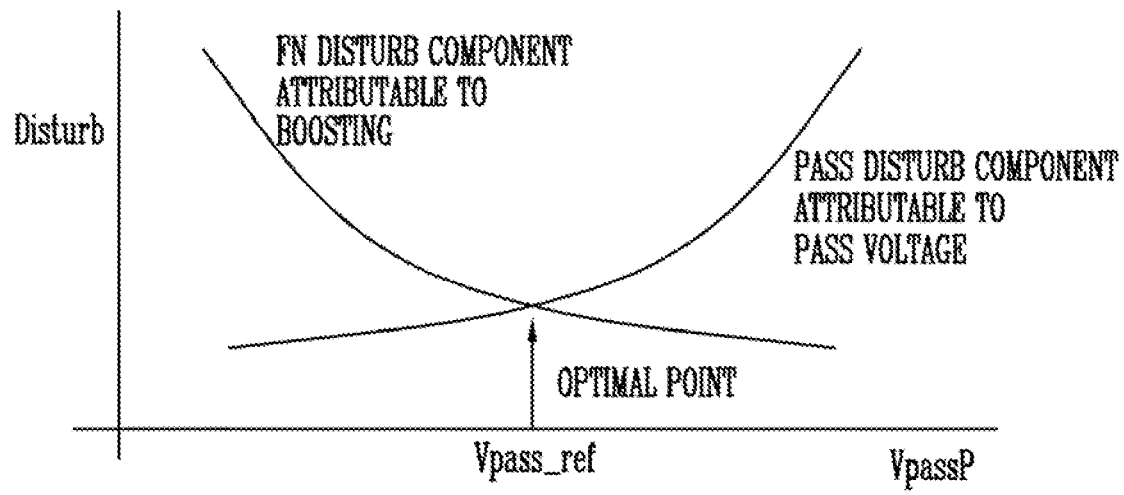
FIG. 6 is a graph explaining a disturb phenomenon depending on a magnitude of a pass voltage of a semiconductor memory device.

FIG. 6 is a graph explaining a disturb phenomenon depending on a magnitude of a pass voltage of a semiconductor memory device.

During a program operation or a read operation of the semiconductor memory device, a program pass voltage VpassP or a read pass voltage (not illustrated) is applied to unselected word lines. Whenever a program loop is repeated or a read operation is repeated, the program pass voltage VpassP or the read pass voltage is applied to the unselected word lines, and the threshold voltages of memory cells which are coupled to the unselected word lines may increase. This phenomenon is referred to as a 'pass disturb phenomenon'. In a wide sense, a disturb phenomenon may refer to the unintentional change of the voltages of memory cells due to various factors. Disturb components may be classified based on the various factors that may cause the disturb. For example, disturb components may include a pass disturb component attributable to the pass voltage and an FN disturb component attributable to a difference between a voltage at a gate electrode of a memory cell and a channel voltage as a voltage in the channel of a memory cell string is boosted.

In the graph of FIG. 6, a horizontal axis indicates a program pass voltage VpassP applied to unselected word lines during a program operation and a vertical axis indicates the amount of disturb.

Referring to FIG. 6 as the magnitude of the program pass voltage VpassP increases, a pass disturb component attributable to the program pass voltage may also increase, and an FN (FOWLER-NORDHEIM) disturb component attributable to channel boosting may decrease. On the other hand, as the magnitude of the program pass voltage VpassP decreases, an FN disturb component attributable to channel boosting may increase, and a pass disturb component attributable to the pass voltage may decrease.

Therefore, an optimal level of the pass voltage (Vpass_ref) of the semiconductor memory device may be determined to correspond at the intersection point of the pass disturb component and the FN disturb component lines, in order to minimize the disturb.

Figures 7, 8:
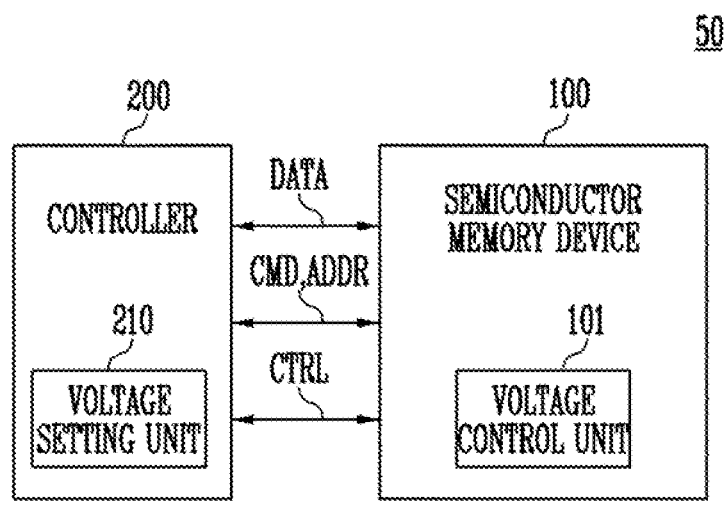
FIG. 7 is a table explaining a method of selecting the magnitude of a program voltage and a pass voltage according to the program speed of a semiconductor memory device, according to an embodiment of the present disclosure.
FIG. 8 is a block diagram illustrating a storage device, according to an embodiment of the present disclosure.

FIG. 7 is a table illustrating the magnitude of pass voltage and of the program voltage of a semiconductor memory device as a function of the program speed of the semiconductor device, according to an embodiment of the present disclosure.

The pass voltage of the semiconductor memory device according to an embodiment of the present disclosure may be determined depending on the program speeds of memory cells. Specifically, since the program state of memory cells having a high program speed may be easily changed even at a relatively low-level voltage, a high-level voltage is not required for the memory cells having the high program speed. In contrast, since the program state of memory cells having a low program speed may be changed only when a high voltage is applied, a high-level voltage should be applied to the memory cells having the low program speed.

Hence, according to an embodiment of the present invention illustrated in FIG. 7, the level of program voltage, and the level of pass voltage of semiconductor memory devices A, B, and C correspond to the program speed levels of the semiconductor memory devices.

Specifically, in the illustrated example, the program speed of semiconductor memory device A is greater than the program speed of semiconductor memory device B, and the program speed of semiconductor memory device B is greater than the program speed of semiconductor memory device C.

In this case, if the levels of the program voltages and the pass voltages which are applied to the semiconductor memory device A (NAND A), the semiconductor memory device B (NAND B), and the semiconductor memory device C (NAND C) are the same then the semiconductor memory device A (NAND A) may have a large pass disturb component and the semiconductor memory device C may have a large FN disturb component from the standpoint of disturb components which is not an optimum situation in terms of the total disturb (See FIG. 6).

In order to minimize the total disturb, the magnitude of the program voltages and of the pass voltages, may be selected to correspond to the program speeds of the semiconductor devices, i.e., in the same sequence as the program speeds, i.e., VPGM A<VPGM B<VPGM C, and VPASS A<VPASS B<VPASS C). In other words the magnitude (also referred to as "level") of the program voltage and of the pass voltage applied to semiconductor devices or to regions of memory cells of a semiconductor device may be adjusted in an inverse relationship to the program speed of the semiconductor device or of the regions of memory cells, so that higher magnitude program voltage and pass voltage are applied to semiconductor memory devices and regions of memory cells having lower program speed than semiconductor devices or regions of memory cells having higher program speed.

FIG. 8 is a block diagram illustrating a storage device 50 according to an embodiment of the present disclosure.

Referring to FIG. 8, the storage device 50 may include a semiconductor memory device 100 and a memory controller 200.

The semiconductor memory device 100 is identical to the semiconductor memory device 100, described above with reference to FIG. 1.

The semiconductor memory device 100 may perform a program operation, a read operation, and an erase operation under the control of the memory controller 200. The semiconductor memory device 100 may exchange data DATA with the memory controller 200. For example, the semiconductor memory device 100 may receive program data from the memory controller 200 and may write the received program data into memory cells. The semiconductor memory device 100 may perform a read operation and may output read data to the memory controller 200.

The semiconductor memory device 100 may receive a command CMD and an address ADDR from the memory controller 200. In an embodiment, the semiconductor memory device 100 may exchange a control signal CTRL with the memory controller 200. For example, the semiconductor memory device 100 may receive at least one of various control signals from the memory controller 200. The control signals may include a chip select signal /CE that selects any of memory units constituting the semiconductor memory device 100, a command latch enable signal CLE that indicates that a signal received from the memory controller 200 is the command CMD, an address latch enable signal ALE that indicates that a signal received from the memory controller 200 is the address ADDR, a read enable signal /RE that is generated by the memory controller 200 during a read operation and is periodically toggled to be used to adjust timing, a write enable signal /WE that is activated by the memory controller 200 when the command CMD or the address ADDR is transmitted, a write protection signal /WP that is activated by the memory controller 200 in order to prevent unintentional programming or erasure from being performed when power changes, and a data strobe signal DQS that is generated by the memory controller 200 during a program operation and is periodically toggled to be used to adjust an input synchronization of the data DATA.

In an embodiment, the semiconductor memory device 100 may output, to the memory controller 200, at least one of a ready and busy signal R/nB that indicates whether any one of a write operation, an erase operation and a read operation is currently being performed on the semiconductor memory device 100, and a data strobe signal DQS that is generated by the semiconductor memory device 100 based on the read enable signal /RE received from the memory controller 200 and is periodically toggled to be used to adjust an output synchronization of the data DATA.

The memory controller 200 is configured to control the semiconductor memory device 100. For example, the memory controller 200 may control the semiconductor memory device 100 so as to perform a program operation, a read operation or an erase operation. The memory controller 200 may exchange the data DATA and the control signal CTRL with the semiconductor memory device 100, and may output the command CMD and the address ADDR to the semiconductor memory device 100.

In an embodiment of the present disclosure, the memory controller 200 may include a voltage setting unit 210. The voltage setting unit 210 may set the number of applications, the levels, and the application time of voltages used for a program operation, a read operation or an erase operation of the semiconductor memory device 100. In detail the voltage setting unit 210 may measure the program speeds of the memory cells included in the semiconductor memory device 100, and may set the number of applications, the levels, and the application time of the voltages used for the program operation, read operation or erase operation of the semiconductor memory device 100, depending on the program speeds. In an embodiment, the voltage setting unit 210 may set the level of the program pass voltage or read pass voltage of the semiconductor memory device 100 depending on the program speeds of the memory cells in the semiconductor memory device 100.

In detail, the memory controller 200 may transmit a command and an address required to measure the program speeds of the memory cells in the semiconductor memory device 100. For example, the memory controller 200 may transmit a program command, an address and data to the semiconductor memory device 100. In an embodiment, the memory controller 200 may transmit a test program command to the semiconductor memory device 100. The semiconductor memory device 100 may perform a program operation for measuring program speeds in response to the test program command. Here, the semiconductor memory device 100 may perform a program operation in which a verify step is not performed.

In order to verify the results of programming, the memory controller 200 may transmit a read command and an address to the semiconductor memory device 100. The semiconductor memory device 100 may read data from the corresponding address in response to the read command and may provide the read data to the memory controller 200.

In an embodiment, the program operation and the read operation performed by the memory controller 200 to measure the program speeds of the memory cells may be performed on all or some of the memory cells included in the semiconductor memory device 100. In this case, the average of the program speeds of all of the memory cells may be the program speed of the corresponding semiconductor memory device 100.

The voltage setting unit 210 may set the level of the pass voltage of the semiconductor memory device 100 based on the measured program speed of the semiconductor memory device 100. In an embodiment, the pass voltage may include a program pass voltage and a read pass voltage. For example, the memory controller 200 may change or update the setting information stored in the voltage control unit 101 of the semiconductor memory device 100 by transmitting a parameter set (SET PARAMETER) command or a feature set (SET FEATURE) command to the semiconductor memory device 100.

In an embodiment, when power is supplied to the semiconductor memory device 100, the memory controller 200 may measure the program speeds of the memory cells, and may set the voltage of the semiconductor memory device 100. Alternatively, the memory controller 200 may measure the program speeds of memory cells and may then set the voltage of the semiconductor memory device 100 whenever the number of erase-write operations (i.e., erase-write count: EW count) of the semiconductor memory device 100 reaches a preset value.

Figure 9:
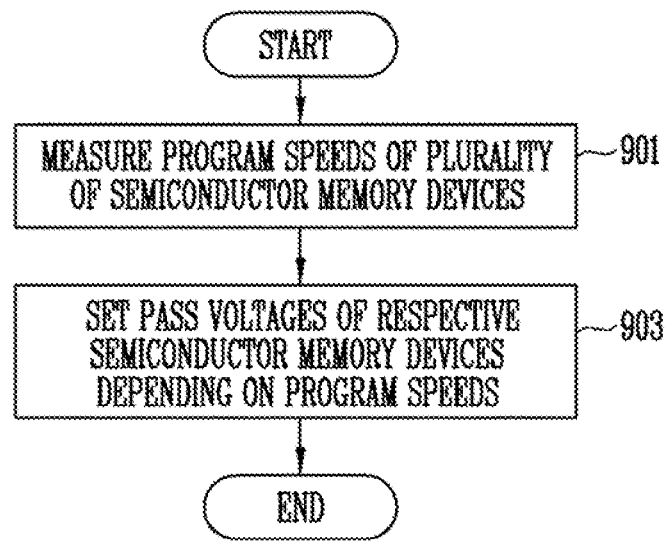
FIG. 9 is a flowchart of an operation of a storage device, according to an embodiment of the present disclosure.

FIG. 9 is a flowchart explaining an operation of a storage device, according to an embodiment of the present disclosure.

Referring to FIG. 9, the storage device may respectively measure the program speeds of a plurality of semiconductor memory devices at step 901. More specifically, the memory controller may transmit a program command, an address, and data to each semiconductor memory device or may transmit a test program command thereto, and each semiconductor memory device may perform a program operation or a test program operation in response to the received command. In an embodiment, the test program operation may be a program operation in which a verify step is not performed. Thereafter, the memory controller may transmit a read command and an address to each semiconductor memory device. Each semiconductor memory device may read data from the corresponding address in response to the read command, and may provide the read data to the memory controller. In an embodiment, the program operation and the read operation performed by the memory controller in order to measure the program speeds of the memory cells may be performed on all or some of the memory cells included in the semiconductor memory device. Here, the average of the program speeds of all of the memory cells may be the program speed of the corresponding memory device.

At step 903, the storage device may set the levels of the pass voltages of respective semiconductor memory devices depending on the measured program speeds. Among the memory cells included in the semiconductor memory devices, "off-cell" is a memory cell having a threshold voltage higher than the read voltage when the selected page is read by the read operation. Therefore, as the number of off-cells increases, the program speeds of memory cells of the semiconductor memory device may be determined higher. Since the number of off-cells may indicate the program speeds of the memory cells of the semiconductor memory device, the memory controller may set the levels of pass voltages of the semiconductor memory devices based on the number of off-cells in the read data. For example, the memory controller may compare one or more reference values with the number of off-cells, and may set the level of the pass voltage of each semiconductor memory device based on the results of comparison. In an embodiment, the pass voltage may include a program pass voltage and a read pass voltage. The memory controller may set the level of the pass voltage depending on a scheme for changing or updating the setting information stored in each semiconductor memory device by transmitting a parameter set (SET PARAMETER) command or a feature set (SET FEATURE) command to the corresponding semiconductor memory device.

Figure 10:
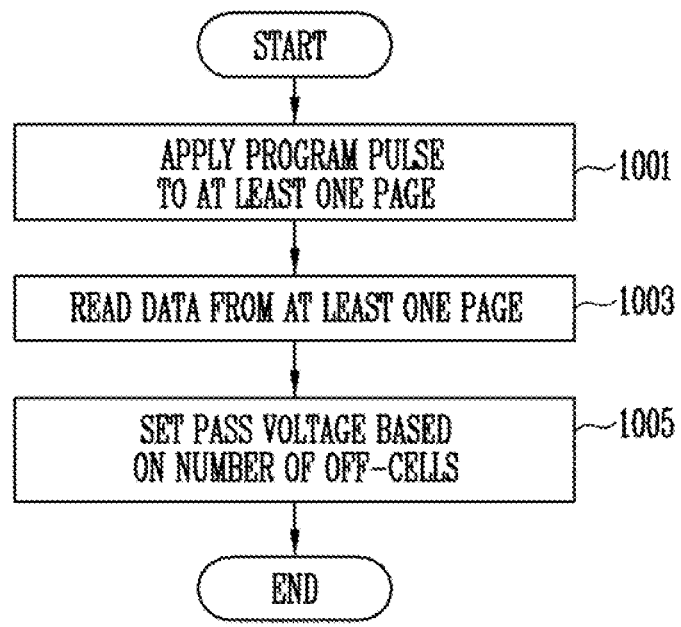
FIG. 10 is a flowchart of an operation of a storage device, according to an embodiment of the present disclosure.

FIG. 10 is a flowchart explaining an operation of a storage device, according to an embodiment of the present disclosure.

FIG. 10 illustrates in detail the operation of the storage device of FIG. 9. Referring to FIG. 10, at step 1001, the storage device may apply a program pulse to at least one page.

In detail, the memory controller may transmit a command and an address required to measure the program speeds of the memory cells of each semiconductor memory device. For example, the memory controller may transmit a program command, an address, and data to the semiconductor memory device. In an embodiment, the memory controller may transmit a test program command to the semiconductor memory device. The semiconductor memory device may perform a program operation for measuring program speeds in response to the test program command. In this case, the semiconductor memory device may perform a program operation in which a verify step is not performed.

The semiconductor memory device may apply a program pulse to at least one page included in the semiconductor memory device in response to the received command. For example, the semiconductor memory device may apply a program pulse to at least one word line. The level of the program pulse to be applied, the number of applications of the program pulse, and the application time of the program pulse are not limited by the embodiment of the present disclosure.

At step 1003, the storage device may read data from at least one page to which the program pulse is applied at step 1001.

In detail, the memory controller may transmit a read command and an address for the semiconductor memory device in order to verify the results of programming. The semiconductor memory device may read data from the corresponding address in response to the read command and may provide the read data to the memory controller. In an embodiment, the program operation and the read operation performed by the memory controller in order to measure the program speeds of the memory cells may be performed on all or some of the memory cells included in the semiconductor memory device. Here the average of the program speeds of all of the memory cells may be the program speed of the corresponding semiconductor memory device.

At step 1005, the storage device may count the number of off-cells based on the read data, and may set the pass voltage based on the number of off-cells.

In detail, the memory controller may set the level of the pass voltage of the semiconductor memory device based on the measured program speed of the semiconductor memory device. In an embodiment, the pass voltage may include a program pass voltage and a read pass voltage.

The memory controller may compare one or more reference values with the number of off-cells and may set the level of the pass voltage of the semiconductor memory device based on the results of the comparison.

The memory controller may transmit the set level of the pass voltage to the semiconductor memory device. For example, the memory controller may change or update the setting information stored in the voltage control unit 101 of the semiconductor memory device 100, described above with reference to FIG. 1, by transmitting the parameter set (SET PARAMETER) command or the feature set (SET FEATURE) command to the semiconductor memory device 100.

In an embodiment, when power is supplied to the semiconductor memory device, the memory controller may measure program speeds of the memory cells and may set the voltage of the semiconductor memory device. Alternatively, the memory controller may measure the program speeds of the memory cells and may set the voltage of the semiconductor memory device 100 whenever the erase-write count (EW count) of the semiconductor memory device reaches a preset value.

FIG. 11 is a table explaining a method for determining a in pass voltage of a semiconductor memory device, according to an embodiment of the present disclosure.

Referring to FIG. 11, the voltage setting unit 210 of the memory controller 200, described above with reference to FIG. 8, may count the number of off-cells (OC) based on the read data received from the semiconductor memory device 100, and may compare the count value with one or more preset reference values.

As the number of off-cells increases, the program speeds of memory cells of the semiconductor memory device may be higher. For example, the voltage setting unit 210 of the memory controller 200 may set a first pass voltage VPASS1 as the reference pass voltage of the semiconductor memory device when the number of off-cells (OC) is equal to or greater than 0 and is less than a first reference value ref1. Alternatively, the voltage setting unit 210 may set a second pass voltage VPASS2 as the reference pass voltage of the semiconductor memory device when the number of off-cells (OC) is equal to or greater than the first reference value ref1 and is less than a second reference value ref2. Alternatively, the voltage setting unit 210 may set a third pass voltage VPASS3 as the reference pass voltage of the semiconductor memory device when the number of off-cells (OC) is equal to or greater than the second reference value ref2 and is less than a third reference value ref3. Alternatively, the voltage setting unit 210 may set an nth pass voltage VPASSn as the reference pass voltage of the semiconductor memory device when the number of off-cells (OC) is equal to or greater than an n–1-th reference value refn–1 and is less than an nth reference value refn. For reference, the voltage level may be sequentially decreased from the first pass voltage VPASS1 to the n-th pass voltage VPASSn.

Figure 12:
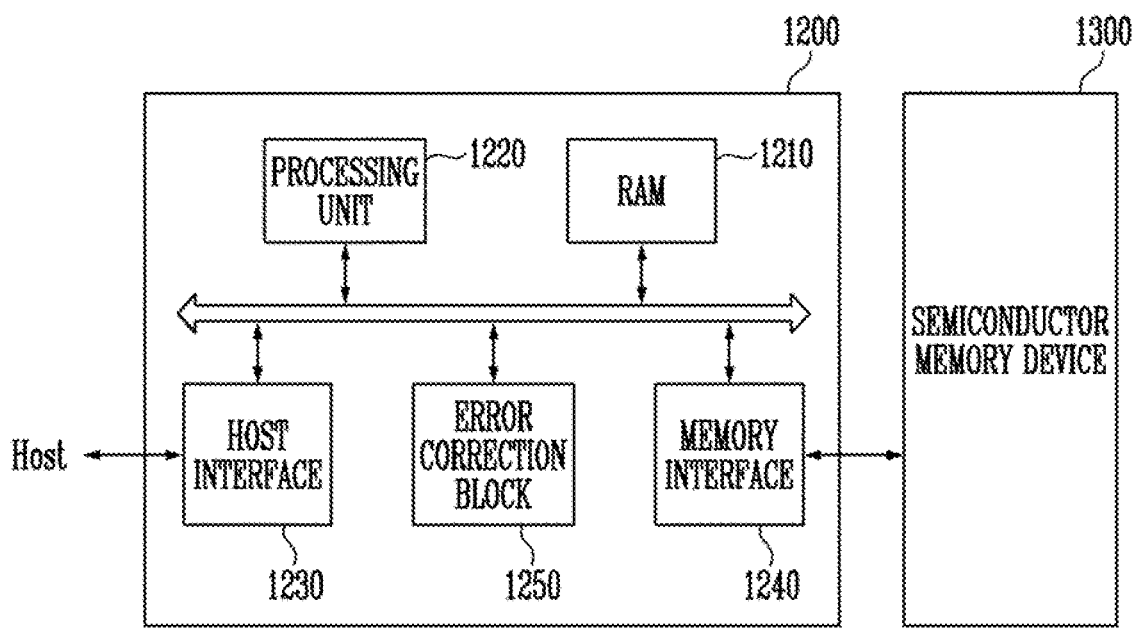
FIG. 12 is a block diagram illustrating storage device shown in FIG. 8.

FIG. 12 is a block diagram illustrating a storage device 1000 according to an embodiment of the present disclosure.

Referring to FIG. 12, the storage device 1000 includes a semiconductor memory device 1300 and a controller 1200.

The semiconductor memory device 1300 may have substantially the same configuration and operation as the semiconductor memory device 100 described with reference to FIG. 1. Hereinafter, repetitive explanations will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the host Host and the semiconductor memory device 1300. The controller 1200 is configured to run firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as any one of a work memory of the processing unit 1220, a cache memory between the semiconductor memory device 1300 and the host Host, and a buffer memory between the semiconductor memory device 1300 and the host Host.

The processing unit 1220 controls the operation of the controller 1200. The processing unit 1220 is configured to control a read operation a program operation, an erase operation and a background operation of the semiconductor memory device 1300. The processing unit 1220 is configured to run firmware for controlling the semiconductor memory device 1300. The processing unit 1220 may perform a function of a Flash Translation Layer (FTL). The processing unit 1220 may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The processing unit 1220 is configured to randomize data received from the host Host. For example the processing unit 1220 may randomize the data received from the host Host using a randomizing seed. The randomized data is provided, as data to be stored, to the semiconductor memory device 1300 and is then programmed in the memory cell array.

The processing unit 1220 is configured to derandomize the data received from the semiconductor memory device 1300 during a read operation. For example, the processing unit 1220 may derandomize the data received from the semiconductor memory device 1300 using a derandomzing seed. The derandomized data may be outputted to the host Host.

In an embodiment, the processing unit 1220 may perform randomize and derandomize operations by running software or firmware.

The host interface 1230 includes a protocol for performing data exchange between the host Host and the controller 1200. In an exemplary embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 interfaces with the semiconductor memory device 1300. For example, the memory interface 1240 includes a NAND interface or NOR interface.

The error correction block 1250 is configured to use an error correcting code (EEC) to detect and correct an error in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

The controller 1200 and the semiconductor memory device 1300 may be integrated into a single semiconductor device. In an exemplary embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data in a semiconductor memory. When the storage device is used as the SSD, an operation speed of the host Host coupled to the storage device may be phenomenally improved.

In an embodiment, the storage device 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 100 or the storage device 1000 may be embedded in various types of packages. For example, the semiconductor memory device 1300 or the storage device 1000 may be packaged in a type such as Package on Package (PoP), Ball grid arrays BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 13:
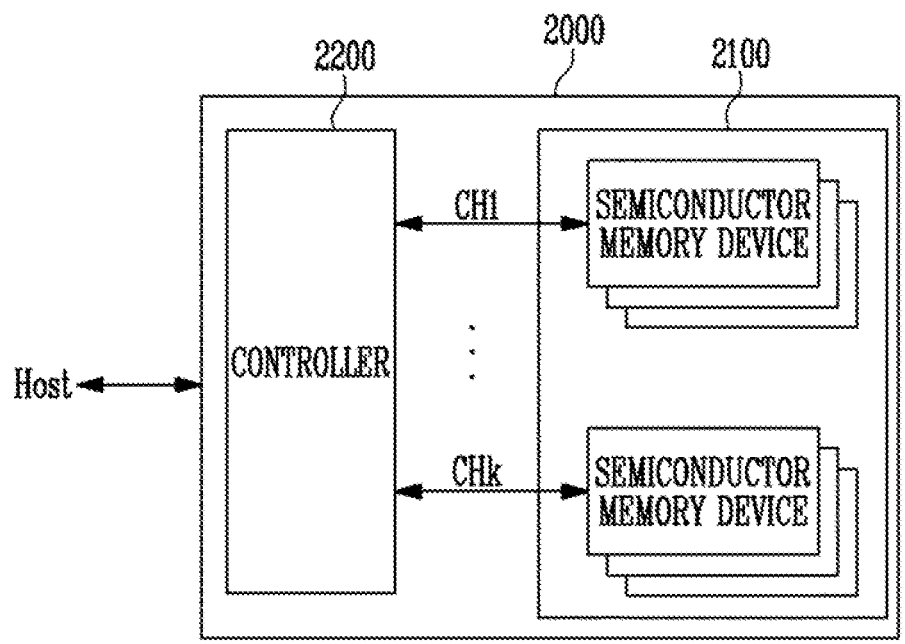
FIG. 13 is a block diagram illustrating a storage device shown in FIG. 12.

FIG. 13 is a block diagram illustrating a storage device 2000 according to an embodiment of the present disclosure.

Referring to FIG. 13, the storage device 2000 includes a semiconductor memory device 2100 and a controller 2200. The semiconductor memory device 2100 includes a plurality of semiconductor memory devices. The semiconductor memory devices are divided into a plurality of groups.

In FIG. 13, it is illustrated that each of the plurality of groups communicates with the controller 2200 through first to k-th channels CH1 to CHk. Each semiconductor memory device may have the same configuration and operation as those of an embodiment of the semiconductor memory device 100 described with reference to FIG. 1.

Each group communicates with the controller 2200 through one common channel. The controller 2200 has substantially the same configuration as that of the controller 1200 described with reference to FIG. 12 and is configured to control the plurality of memory storage devices of the semiconductor memory device 2100 through the plurality of channels CH1 to CHk.

In FIG. 13, a description has been made such that a plurality of semiconductor memory devices are coupled to a single channel. However, it will be understood that the storage device 2000 may be modified such that a single semiconductor memory device is coupled to a single channel.

Figure 14:
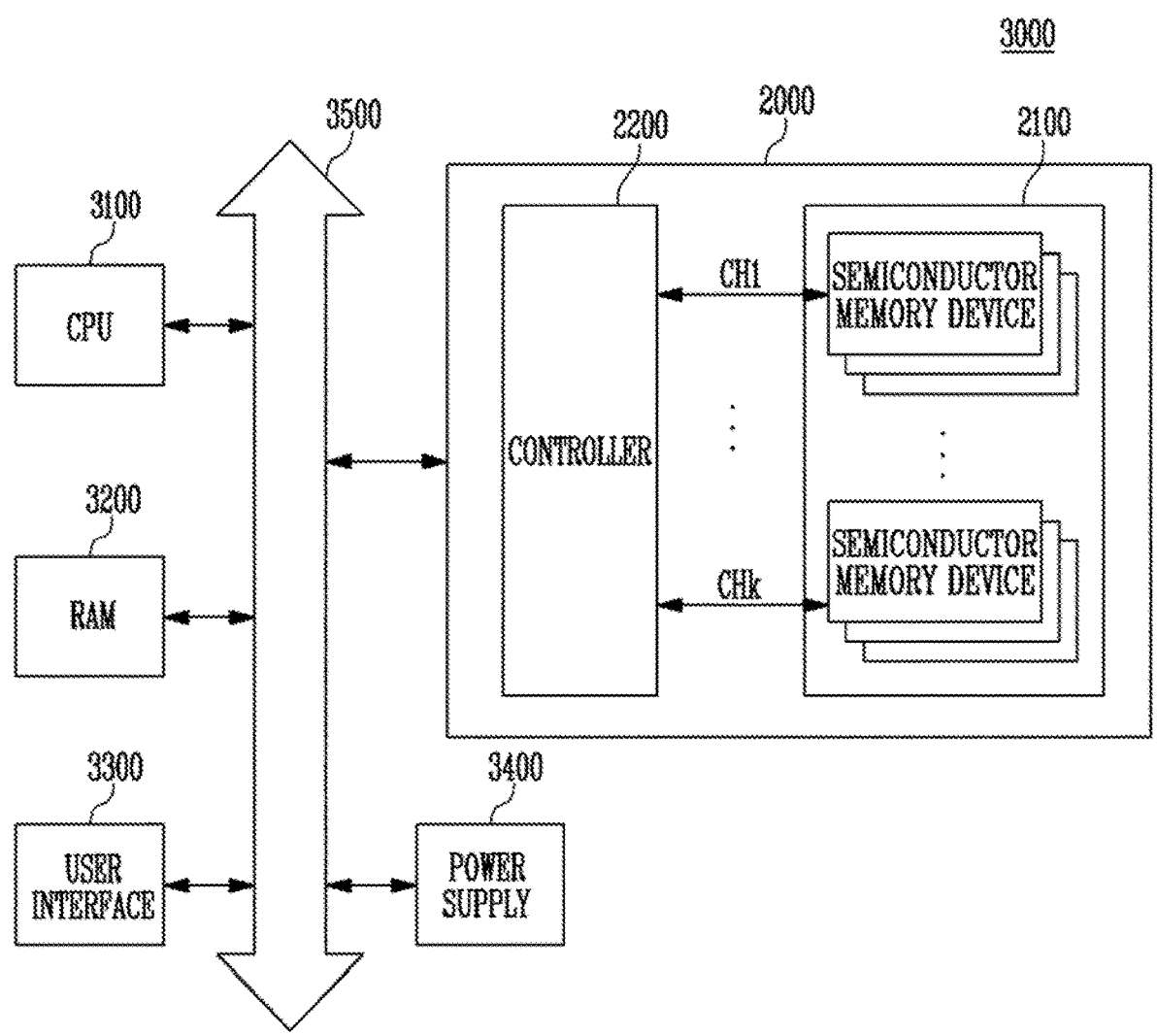
FIG. 14 is a block diagram illustrating a computing system including the storage device shown in FIG. 13.

FIG. 14 is a block diagram illustrating a computing system 3000 including the storage device 2000 shown in FIG. 13.

Referring to FIG. 14, the computing system 3000 may include a central processing unit (CPU) 3100, a RAM 3200, a user interface 3300, a power supply 3400, a system bus 3500, and a storage device 2000.

The storage device 2000 is electrically coupled to the CPU 3100 the RAM 3200, the user interface 3300, and the power supply 3400 through the system bus 3500. Data provided through the user interface 3300 or processed by the CPU 3100 is stored in the storage device 2000.

In FIG. 14, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 14, the storage device 2000 described with reference to FIG. 13 is illustrated as being provided. However, the storage device 2000 may be replaced with the storage device 1000 described with reference to FIG. 12. In an embodiment, the computing system 3000 may be configured to include all of the storage devices 1000 and 2000 described with reference to FIGS. 12 and 13.

In accordance with the present disclosure, there are provided a storage device having improved disturb characteristics and a method of operating the storage device.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array including a plurality of memory blocks;
a peripheral circuit configured to perform operations on the memory cell array; and
a control logic configured to control the peripheral circuit based on setting information stored in a contents addressable memory (CAM) block, among the plurality of memory blocks, while the operations are performed,
wherein the setting information comprises a level of a pass voltage applied to a plurality of memory cells included in the memory cell array,
wherein the level of the pass voltage is determined depending on program speeds of the plurality of memory cells, and
wherein the pass voltage is determined depending on an average of program speeds of the plurality of memory cells.

2. The semiconductor memory device according to claim 1, wherein the pass voltage comprises a program pass voltage or a read pass voltage that is applied to unselected memory cells during a program operation or a read operation performed on the plurality of memory cells.

3. The semiconductor memory device according to claim 1, wherein the pass voltage has a higher level as the program speeds of the plurality of memory cells are higher.

4. A storage device, comprising:
one or more semiconductor memory devices, each including a plurality of memory cells; and a memory controller configured to set a level of a pass voltage of each of the one or more semiconductor memory devices depending on an average of program speeds of the plurality of memory cells of each of the one or more semiconductor memory devices.

5. The storage device according to claim 4, wherein the memory controller comprises:
a voltage setting unit configured to measure the program speeds of the one or more semiconductor memory devices, set the pass voltage depending on the average of the measured program speeds, and provide the pass voltage to each of the semiconductor memory devices.

6. The storage device according to claim 5, wherein the memory controller is configured to transmit a program command for a part or all of the plurality of memory cells, and transmit a read command for acquiring results of execution of the program command.

7. The storage device according to claim 6, wherein the memory controller is configured to count a number of off-cells from read data provided by each of the one or more semiconductor memory devices in response to the read command.

8. The storage device according to claim 7, wherein the voltage setting unit is configured to compare the number of off-cells with one or more reference values, and determine the pass voltage of each of the one or more semiconductor memory devices.

9. The storage device according to claim 4, wherein the memory controller is configured to provide the pass voltage to each of the one or more semiconductor memory devices using a parameter set command or a feature set command.

10. The storage device according to claim 9, wherein each of the one or more semiconductor memory devices comprises:
a memory cell array including a plurality of memory blocks;
a peripheral circuit configured to perform operations on the memory cell array; and
a voltage control unit configured to store setting information stored in a contents addressable memory (CAM) block, among the plurality of memory blocks.

11. The storage device according to claim 10, wherein each of the one or more semiconductor memory devices further comprises:
a control logic configured to control the peripheral circuit based on the setting information stored in the voltage control unit while the operations are performed.

12. The storage device according to claim 11, wherein the control logic is configured to change or update the setting information stored in the voltage control unit in response to the parameter set command or the feature set command provided from the memory controller.

13. The storage device according to claim 4, wherein each of the pass voltage has a higher level as program speeds of the plurality of memory cells are higher.

14. A method of operating a storage device, the storage device including a semiconductor memory device having a plurality of memory cells and a memory controller configured to control the semiconductor memory device, the method comprising:
measuring program speeds of the plurality of memory cells; and
setting a level of a pass voltage of the semiconductor memory device depending on an average of the measured program speeds.

15. The method according to claim 14, wherein the pass voltage comprises a program pass voltage or a read pass voltage that is applied to unselected memory cells during a program operation or a read operation performed on the plurality of memory cells.

16. The method according to claim 14, wherein the pass voltage has a higher level as the program speeds of the plurality of memory cells are higher.

17. The method according to claim 14, wherein the measuring comprises:
performing a program operation on a part or all of the plurality of memory cells; and
performing a read operation on memory cells on which the program operation has been performed.

18. The method according to claim 17, wherein the setting is configured to set the pass voltage based on a number of off-cells in read data acquired during the read operation.

* * * * *